(12) United States Patent
Wang

(10) Patent No.: US 11,276,438 B2
(45) Date of Patent: Mar. 15, 2022

(54) SENSITIVITY AMPLIFIER, DRIVING METHOD AND MEMORY DEVICE

(71) Applicant: ChangXin Memory Technologies, Inc., Hefei (CN)

(72) Inventor: Ying Wang, Hefei (CN)

(73) Assignee: CHANGXIN MEMORY TECHNOLOGIES, INC., Hefei (CN)

(*) Notice: Subject to any disclaimer, the term of this patent is extended or adjusted under 35 U.S.C. 154(b) by 0 days.

(21) Appl. No.: 17/055,106

(22) PCT Filed: Dec. 16, 2019

(86) PCT No.: PCT/CN2019/125746
§ 371 (c)(1),
(2) Date: Nov. 12, 2020

(87) PCT Pub. No.: WO2021/036104
PCT Pub. Date: Mar. 4, 2021

(65) Prior Publication Data
US 2021/0366523 A1    Nov. 25, 2021

(30) Foreign Application Priority Data

Aug. 30, 2019   (CN) .......................... 201910818772.9

(51) Int. Cl.
*G11C 7/06*   (2006.01)
*G11C 7/08*   (2006.01)

(52) U.S. Cl.
CPC ................ *G11C 7/062* (2013.01); *G11C 7/08* (2013.01)

(58) Field of Classification Search
CPC ................... G11C 7/062; G11C 7/08

USPC ................ 365/196, 205, 207, 154
See application file for complete search history.

(56) References Cited

U.S. PATENT DOCUMENTS

| 2007/0201290 A1 | 8/2007 | Kang et al. |
| 2015/0046723 A1* | 2/2015 | Park .......................... G11C 7/08 713/300 |
| 2015/0364166 A1* | 12/2015 | Im ............................ G11C 7/08 365/189.11 |

(Continued)

FOREIGN PATENT DOCUMENTS

| CN | 103544979 A | 1/2014 |
| CN | 210156119 U | 3/2020 |

(Continued)

OTHER PUBLICATIONS

PCT//CN2019/125746 International Search Report dated May 20, 2020.

*Primary Examiner* — Connie C Yoha
(74) *Attorney, Agent, or Firm* — Alston & Bird LLP

(57) ABSTRACT

The present disclosure describes a sensitivity amplifier in the field of storage technology. The sensitivity amplifier includes: a first inverter, a second inverter, a first switch unit, a second switch unit, a third switch unit, a fourth switch unit, a fifth switch unit, the sixth switch unit, the seventh switch unit, and the eighth switch unit. The sensitivity amplifier can control the fifth switch unit, the sixth switch unit, the seventh switch unit, and the eighth switch unit to turn on or off, so that the sensitivity amplifier works in two different power rails, to achieve reduction of the static operating point deviation of the sensitivity amplifier during the noise cancellation stage.

10 Claims, 4 Drawing Sheets

(56) References Cited

U.S. PATENT DOCUMENTS

2017/0032830 A1\*  2/2017  Lee .................... G11C 11/4074
2019/0007000 A1    1/2019  Jeong et al.

FOREIGN PATENT DOCUMENTS

KR        20100100132 A1   9/2010
WO    WO 2021-036104 A1   3/2021

\* cited by examiner

SENSITIVITY AMPLIFIER, DRIVING METHOD AND MEMORY DEVICE

CROSS REFERENCES TO RELATED APPLICATIONS

This application is a national phase entry of International Application No. PCT/CN2019/125746 filed on Dec. 16, 2019, which claims the benefit of priority to CN Patent Application CN201910818772.9 filed on Aug. 30, 2019, both entitled "Sensitivity Amplifier, driving Method and Memory Device", the contents of which are incorporated herein by reference in its entirety.

TECHNICAL FIELD

The present disclosure relates to the storage technology, in particular to a sensitivity Amplifier, its driving Method and memory device.

BACKGROUND

A sensitivity amplifier is a functional device that can be used in a memory device. Turning on the sensitivity amplifier at a suitable time can amplify the weak signal stored in the storage unit, so that the data stored in the storage unit can be correctly written in or read out.

In the related arts, the sensitivity amplifier is mainly composed of a latch, and the two output terminals of the latch are respectively connected to the bit line and the inverted bit line. Considering the mismatch noise of the sensitivity amplifier caused by device mismatch during the amplification process, a noise reduction transistor is usually added to the latch.

However, because of the conductivity differences of N-type transistors and P-type transistors in the latch, the voltages of the bit line and the inverted bit line deviate from the mid-voltage between the power supply and the ground during the noise cancellation stage of the sensitivity amplifier, which finally causes deviations in the verification of storage logic 1 and logic 0 thresholds, which in turn results in a difference in noise tolerance when reading 1 and 0.

It should be noted that the information disclosed in the above background section is only used to enhance the understanding of the background of the present disclosure, and therefore may include information that does not constitute the prior art known to those of ordinary skill in the art.

SUMMARY

According to one aspect of the present disclosure, there is provided a sensitivity amplifier, which includes: a first inverter, comprising a high voltage terminal connected to a first node, a low voltage terminal connected to a second node, wherein an input terminal of the first inverter connects to a reverse bit line;
a second inverter, comprising a high voltage terminal connected to the first node, a low voltage terminal connected to the second node, wherein an input terminal of the second inverter connects to a bit line;
first switch unit connected to the input terminal, an output terminal, and a first control signal terminal of the first inverter, wherein the first switch unit responds to a signal of the first control signal terminal to connect the input terminal and the output terminal of the first inverter;
a second switch unit connected to the input terminal, an output terminal, and a first control signal terminal of the second inverter, wherein the second switch unit responds to a signal of the second control signal terminal to connect the input terminal and the output terminal of the second inverter;
a third switch unit connected to the output terminal of the first inverter, the input terminal of the second inverter, and a second control signal terminal, wherein the third switch unit responds to a signal of the second control signal terminal to connect the output terminal of the first inverter and the input terminal of the second inverter;
a fourth switch unit connected to the output terminal of the second inverter, the input terminal of the first inverter, and the second control signal terminal, wherein the third switch unit responds to the signal of the second control signal terminal to connect the output terminal of the second inverter and the input terminal of the first inverter;
a fifth switch unit connected to a first high-voltage signal terminal, a third control signal terminal, and the first node, wherein the fifth switch unit responds to a signal of the third control signal terminal to transmit a signal from the first high-voltage signal terminal to the first node;
a sixth switch unit connected to a first low-voltage signal terminal, a fourth control signal terminal, and the first node, wherein the sixth switch unit responds to a signal of the fourth control signal terminal to transmit a signal from the first low-voltage signal terminal to the second node;
a seventh switch unit connected to a second high-voltage signal terminal, a fifth control signal terminal, and the first node, wherein the seventh switch unit responds to a signal of the fifth control signal terminal to transmit a signal from the second high-voltage signal terminal to the second node; and
an eighth switch unit connected to a second low-voltage signal terminal, a sixth control signal terminal, and the second node, wherein the eighth switch unit responds to a signal of the sixth control signal terminal to transmit a signal from the second low-voltage signal terminal to the second node;
wherein, a voltage of the first high-voltage signal terminal is greater than a voltage of the second high-voltage signal terminal, and a voltage of the first low-voltage signal terminal is greater than a voltage of the second low-voltage signal terminal; or
wherein the voltage of the first high-voltage signal terminal is smaller than the voltage of the second high-voltage signal terminal, and the voltage of the first low-voltage signal terminal is smaller than the voltage of the second low-voltage signal terminal.

In some examples, the first inverter comprises: a first P-type transistor, having a first terminal connected to the first node, a control terminal connected to the input terminal of the first inverter, and a second terminal connected to the output terminal of the first inverter; a second N-type transistor, having a first terminal connected to the second node, a control terminal connected to the input terminal of the first inverter, and a second terminal connected to the output terminal of the first inverter.

In some examples, the second inverter comprises: a third P-type transistor, having a first terminal connected to the first node, a control terminal connected to the input terminal of the second inverter, and a second terminal connected to the output terminal of the second inverter; and a fourth N-type transistor, having a first terminal connected to the second node, a control terminal connected to the input terminal of the second inverter, and a second terminal connected to the output terminal of the second inverter.

In some examples, the first switch unit comprises: a fifth transistor, having a first terminal connected to the input terminal of the first inverter, a second terminal connected to the output terminal of the first inverter, and a control terminal connected to the first control signal terminal of the first inverter; and wherein the second switch unit comprises: a sixth transistor, having a first terminal connected to the input terminal of the second inverter, the second terminal connected to the output terminal of the second inverter, and a control terminal connected to the first control signal terminal of the second inverter.

In some examples, the third switch unit comprises: a third switch transistor, having a first terminal connected to the output terminal of the first inverter, a second terminal connected to the input terminal of the second inverter, and a control terminal connected to the second control signal terminal; and wherein the fourth switch unit comprises: an eighth transistor, having a first terminal connected to the output terminal of the second inverter, a second terminal connected to the input terminal of the first inverter, and a control terminal connected to the second control signal terminal.

In some examples, the fifth switch unit comprises: a ninth transistor, having a first terminal connected to the first high-voltage signal terminal, a second terminal connected to the first node, and a control terminal connected to the third control signal terminal; and wherein the sixth switch unit includes: a tenth transistor, having a first terminal connected to the first low-voltage signal terminal, a second terminal connected to the second node, and a control terminal connected to the fourth control signal terminal.

In some examples, the seventh switch unit comprises: an eleventh transistor, having a first terminal connected to the second high-voltage signal terminal, a second terminal connected to the first node, and a control terminal connected to the fifth control signal terminal; wherein the eighth switch unit comprises: a twelfth transistor, having a first terminal connected to the second low-voltage signal terminal, a second terminal connected to the second node, and a control terminal connected to the sixth control signal terminal.

In some examples, the sensitivity amplifier further comprises: a pre-charging unit configured to charge the first node and the second node to the same potential.

According to another aspect of the present disclosure, there is provided a method for driving a sense amplifier for driving the above-mentioned sense amplifier. The method includes:

in an initialization stage, applying effective voltage signals to the first control signal terminal and the second control signal terminal, and applying invalid voltage signals to the third control signal terminal, the fourth control signal terminal, the fifth control signal terminal, and the sixth control signal terminal, and pre-charging the first node and the second node;

in a noise elimination stage, controlling the first control signal terminal, the fifth control signal terminal, and the sixth control signal terminal to output effective voltage signals, and controlling the second control signal terminal, the third control signal terminal, and the fourth control signal terminal to output invalid voltage signals;

in the charge sharing stage, pre-charging the first node and the second node, controlling the first control signal terminal, the second control signal terminal, the third control signal terminal, the fourth control signal terminal, the fifth control signal terminal and the sixth control signal terminal to output invalid voltage signals, and inputting a data signal to the bit line simultaneously;

in the first amplification stage, controlling the second control signal terminal, the fifth control signal terminal, and the sixth control signal terminal to output effective voltage signals, and controlling the first control signal terminal, the third control signal terminal, and the fourth control signal terminal to output invalid voltage signals, to perform a first amplification process on the data signal; and in the second amplification stage, controlling the second control signal terminal, the third control signal terminal, and the fourth control signal terminal to output effective voltage signals, and controlling the first control signal terminal, the fifth control signal terminal, the sixth control signal terminal to output invalid voltage signals, to perform a second amplification process on the data signal.

In another aspect of the disclosure, a storage device includes the above-mentioned sensitivity amplifier, bit lines and inverted bit lines.

It should be understood that the above general description and the following detailed description are only exemplary and explanatory, and cannot limit the present disclosure.

BRIEF DESCRIPTION OF THE DRAWINGS

The drawings herein are incorporated into the specification and constitute a part of the specification The drawings show embodiments in accordance with the disclosure, and together with the specification are used to explain the principle of the disclosure. Obviously, the drawings in the following description only represent some embodiments of the present disclosure. For those of ordinary skill in the art, other drawings can be obtained based on these drawings without creative work.

DETAILED DESCRIPTION OF THE PREFERRED EMBODIMENTS

Figure 1:
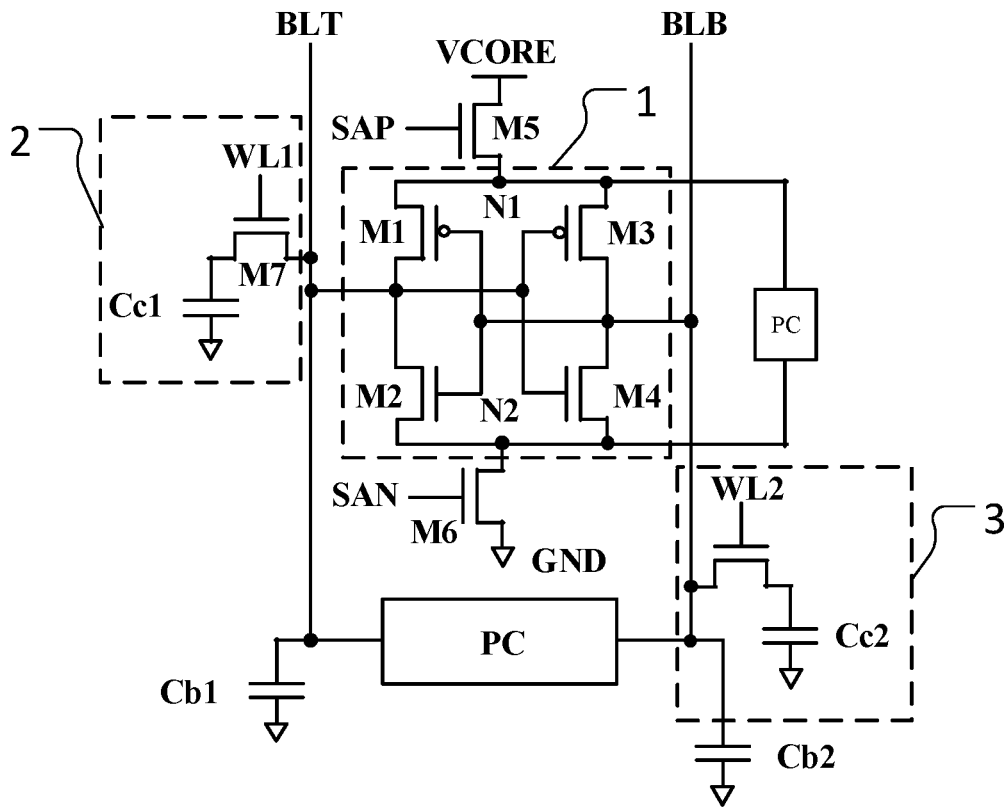
FIG. 1 is a schematic diagram of the structure of a sensitivity amplifier in the related art.

Exemplary embodiments will now be described more fully with reference to the accompanying drawings. However, the exemplary embodiments can be implemented in various forms, and should not be construed as being limited to the examples set forth herein; on the contrary, these embodiments makes the present disclosure more comprehensive and complete, and fully convey the concept of the exemplary embodiments to those skilled in the art. The same reference numerals in the figures represent the same or similar structures, and thus their detailed descriptions will be omitted.

Although relative terms such as "upper" and "lower" are used in this specification to describe the relative relationship of one component of an object to another, these terms are used in this specification only for convenience, for example, the direction described according to the drawings. It can be understood that if the device of the object is turned over therefore turned upside down, the component described as "upper" will become the "lower" component. Other relative terms, such as "high", "low", "top", "bottom", "left" and "right" have similar meanings. When a structure is "on" another structure, it may mean that a certain structure is integrally formed on another structure, or that a certain structure is "directly" arranged on another structure, or that a certain structure is "indirectly" arranged on another structure through yet another structure.

The terms "one", "a", and "the" are used to indicate the presence of one or more elements/components/etc.; the terms "include" and "comprise" are used to indicate open-ended inclusion, and can mean that other than the listed elements/components/etc., there may be additional elements/components/etc.

Figure 2:
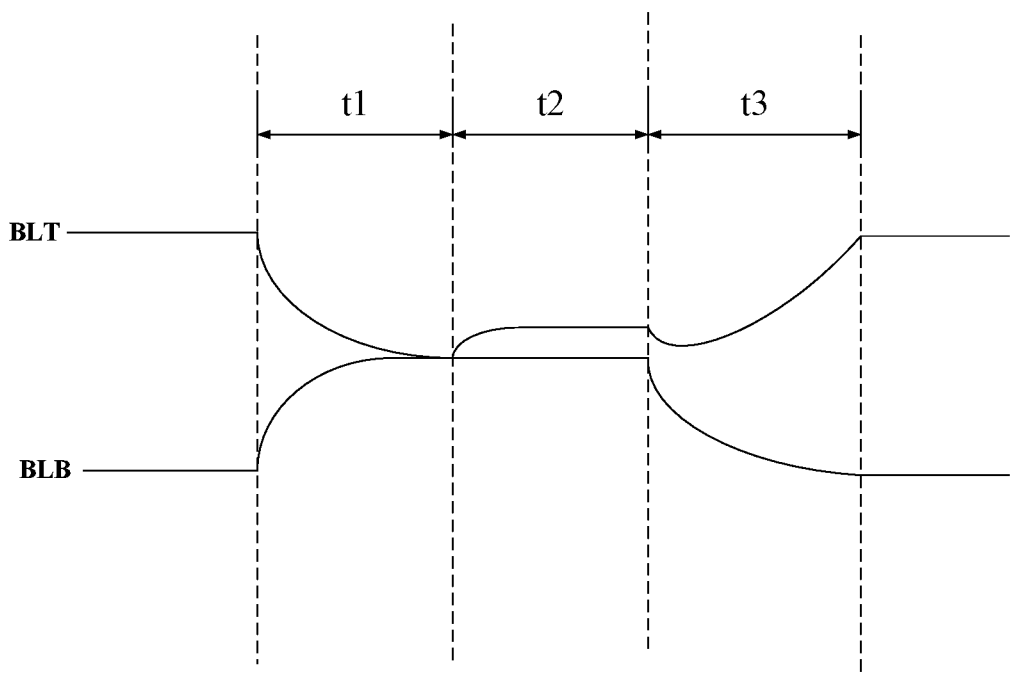
FIG. 2 is a working timing diagram at the output nodes of the sensitivity amplifier in FIG. 1.

As shown in FIG. 1, it is a schematic diagram of the structure of a sensitivity amplifier in the related art. The sensitivity amplifier includes a latch 1, wherein two output terminals of the latch 1 are respectively connected to a bit line BLT and an inverted bit line BLB. The high-voltage terminal N1 of the latch 1 is connected to the high-voltage power supply terminal VCORE through the transistor M5, and the low-voltage terminal N2 of the latch 1 is connected to the ground terminal GND through the transistor M6. Herein, multiple storage unit 2 can be connected to the bit line BLT, multiple storage unit 3 can be connected to the inverted bit line BLB, wired capacitor Cb1 is connected to the bit line BLT, and wired capacitor Cb2 is connected to the inverted bit line BLB. The sensitivity amplifier can amplify the weak signals stored in the storage units 2 and 3, so that the data stored in the storage units can be correctly written out or read. In this embodiment description, reading the high-voltage signal in the storage unit 2 is used as an example. As shown in FIG. 2, which is a working timing diagram of each node of the sensitivity amplifier in FIG. 1, BLT is a timing diagram of signals on the bit line BLT, and BLB is a timing diagram of signals on the inverted bit line BLB. The sensitivity amplifier driving method includes three stages: a pre-charging stage t1, a charge sharing stage t2, and an amplification stage t3. In the pre-charging stage t1, the pre-charging unit PC pre-charges the bit line BLT and the reverse bit line BLB, the high-voltage terminal N1, and the low-voltage terminal N2 with the same voltage respectively. The pre-charge voltage may be half of the voltage of the high-voltage power terminal VCORE. In the charge sharing stage t2, an effective voltage is applied to the word line WL1 connected to the storage unit 2 to turn on the transistor M7, so that the charge stored in the capacitor Cc1 is transferred to the bit line BLT through the transistor M7. At this time, the voltage on the bit line BLT is slightly greater than the voltage on the reverse bit line BLB. In the amplification stage t3, apply effective voltage signals to the control signal terminals SAP and SAN to turn on the transistors M5 and M6, respectively, to put the latch 1 in working state, so that the voltage on the bit line BLT is amplified to equal to the high voltage voltage of the power supply terminal VCORE, and reduces the voltage on the reverse bit line BLB to the voltage at the ground terminal GND.

Figure 3:
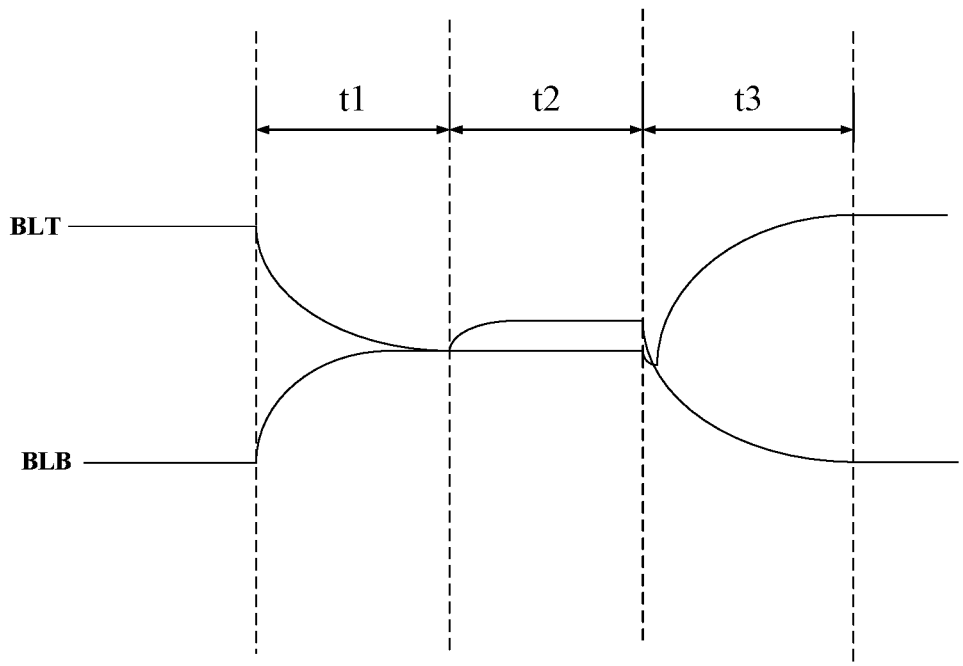
FIG. 3 is another working timing diagram of the sensitivity amplifier in the related art of FIG. 1.

However, as shown in FIG. 2, since the P-type transistor M1 and the N-type transistor M2 have different conductivities, the P-type transistor M3 and the N-type transistor M4 have different conductivities. For example, when the conductivity of the N-type transistor is stronger than that of the P-type transistor, at the beginning of the amplification stage t3, the voltages on the bit line BLT and the inverted bit line BLB all go through a pull-down phase. The pull-down of the mid-point bit line signal BLT is more obvious in FIG. 2. As shown in FIG. 3, which is another working timing diagram of the sensitivity amplifier in the related art of FIG. 1. When the conductivity difference between the N-type transistor M2 and the P-type transistor M1 is greater than that of the N-type transistor M4 and the P-type transistor M3, the pull-down amount of the bit line BLT at the beginning of the amplification stage t3 is greater than the pull-down amount of the inverted bit line BLB at the beginning of the amplification stage t3. As a result, the voltage of the bit line BLT may be lower than the voltage of the inverted bit line BLB, and eventually the voltage of the inverted bit line BLB is amplified and the voltage of the bit line BLT is reduced. It should be understood that when the conductivity of the P-type transistor is stronger than that of the N-type transistor, at the beginning of the amplification stage t3, there is a pull-up phase for the voltage on the bit line BLT and the voltage on the inverted bit line BLB.

Figure 4:
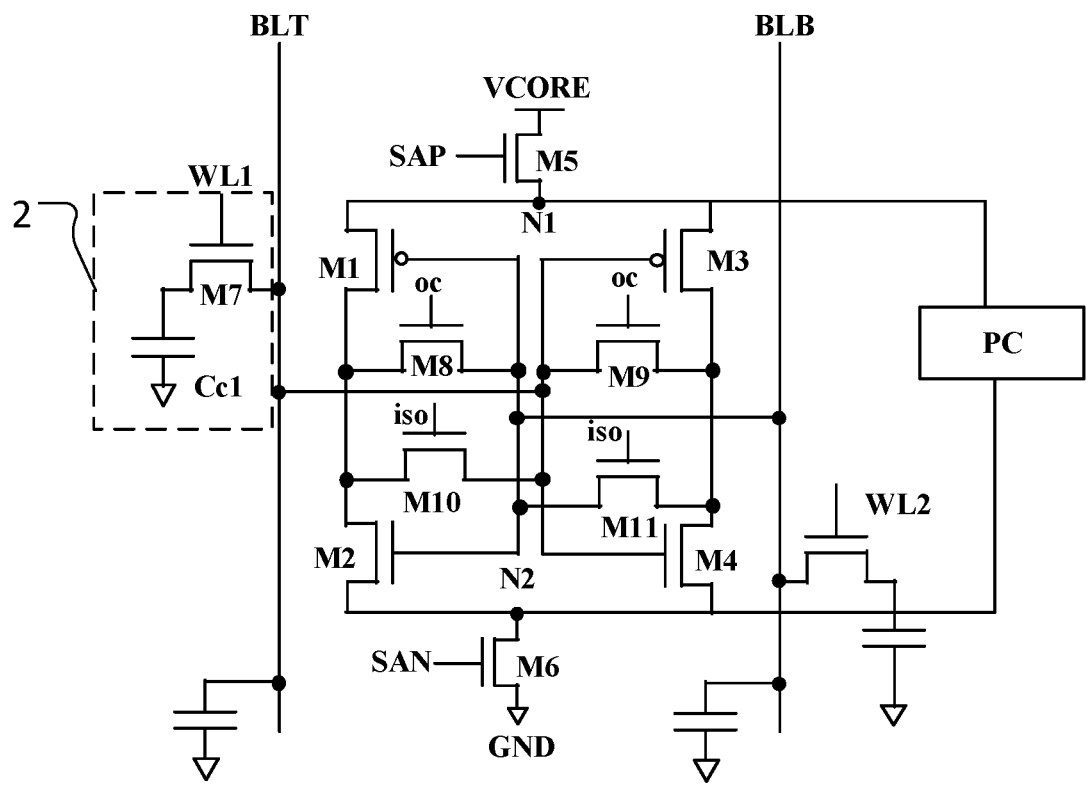
FIG. 4 is a schematic diagram of the structure of another sensitivity amplifier in the related art.
Figure 5:
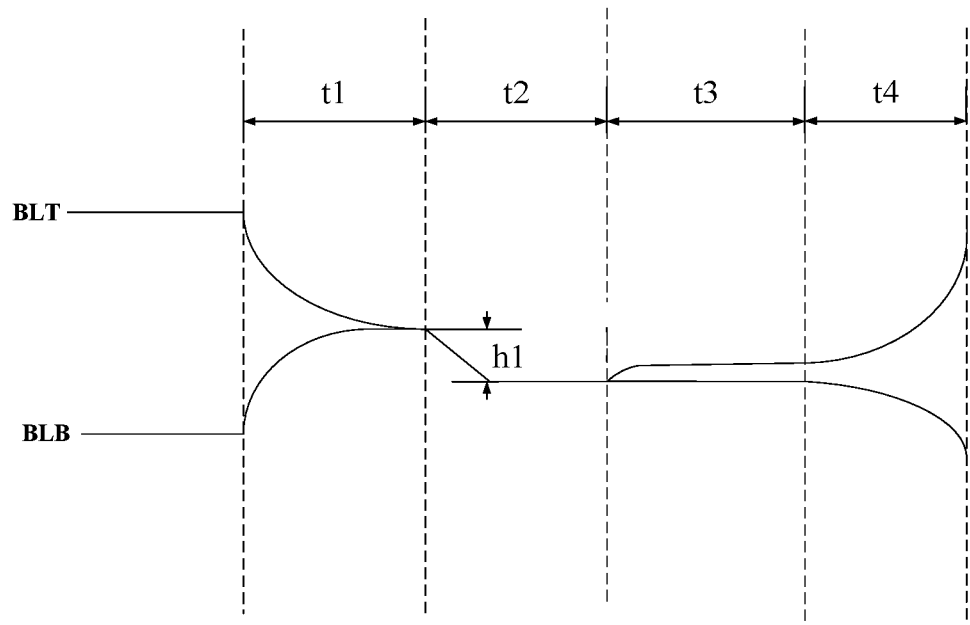
FIG. 5 is a working timing diagram at the output nodes of the sensitivity amplifier in the related art of FIG. 4.

Based on this, another sensitivity amplifier is proposed in the related arts, as shown in FIG. 4, which is a schematic structural diagram of another sensitivity amplifier in the related arts. This sensitivity amplifier adds transistors M8, M9, M10, and M11 to the sensitivity amplifier shown in FIG. 1. As shown in FIG. 5, which is a working timing diagram of all nodes of the sensitivity amplifier in the related art of FIG. 4. BLT is a timing diagram of signals on the bit line BLT, and BLB is a timing diagram of signals on the inverted bit line BLB. The sensitivity amplifier driving method includes four stages: a pre-charging stage t1, a noise elimination stage t2, a charge sharing stage t3, and an amplification stage t4. In the pre-charging stage t1, apply effective voltage signals to the control signal terminals oc and iso to turn on the transistors M8, M9, M10, and M11, and apply invalid voltage signals to the control signal terminals SAP and SAN to turn off the transistors M5 and M6. At the same time, the pre-charging unit PC pre-charges the high-voltage terminal N1 and the low-voltage terminal N2 so that the voltages of the bit line BLT, the inverted bit line BLB, the high-voltage terminal N1 and the low-voltage terminal N2 all equal to the pre-charging voltages, wherein the pre-charging voltage may equal to half of the voltage of the power supply high voltage terminal VCORE. In the noise elimination stage t2, apply effective voltage signals to the control signal terminals oc, SAP, and SAN to turn on the transistors M8, M9, M5, M6, and apply an invalid voltage signal to the control signal terminal iso to turn off the transistors M10, M11. At this stage, the transistors M1 and M2 are connected by diodes, and a voltage divider structure is formed between the high-voltage power supply terminal VCORE and the ground terminal GND. The transistors M3 and M4 are connected by diodes, and form a voltage divider structure between the high-voltage power supply terminal VCORE and the ground terminals GND. Since the conductivity of M2 is greater than that of M1, the conductivity of M4 is greater than that of M3, so that during the noise elimination phase, the bit line BLT and the reverse bit line BLB receive written voltage signals that are less than the pre-charging voltage, thereby avoiding the voltage pull-down phenomenon on the bit line BLT and the reverse bit line BLB in the amplification stage. Here, the voltage drop from the bit line BLT to the reverse bit line BLB is h1. It should be understood that when the conductivity of M1 is greater than the conductivity of M2, and the conductivity of M3 is greater than that of M4, so that during the noise elimination phase, the bit line BLT and the reverse bit line BLB receive written voltage signals that are higher than the pre-charging voltage, thereby avoiding the voltage pull-up phenomenon on the bit line BLT and the reverse bit line BLB in the amplification stage. In the charge sharing phase t3, an invalid voltage signal is applied to the control signal terminals oc, iso, SAP, and SAN to turn off the transistors M8, M9, M10, M11, M5, and M6, and at the same time, applying an effective voltage to the word line WL1 connected to the storage unit 2, so that the charge stored in the capacitor Cc1 is transferred to the bit line BLT through the transistor M7. At this time, the voltage on the bit line BLT is slightly greater than the voltage on the inverted bit line BLB. In the amplification stage t4, apply effective voltage signals to the control signal terminals SAP and SAN to turn on the transistors M5 and M6, respectively, while the control signal terminal iso outputs an effective voltage signal to turn on the transistors M10 and M11 to put the latch into a working state. Therefore, the voltage on the bit line BLT is amplified to the voltage of the high-voltage power supply terminal VCORE, so that the voltage on the inverted bit line BLB is reduced to the voltage of the ground terminal GND.

However, in the related art, in the noise cancellation stage t2, the voltage signal written to the bit line BLT and the inverted bit line BLB is less than the pre-charging voltage, where the pre-charging voltage may be half of the voltage at the high-voltage power terminal VCORE. As a result, there is an error of judgement in the threshold voltage of the storage logic 1 and logic 0, and then an error occurs in the noise tolerance when reading the 1 and 0.

Figure 6:
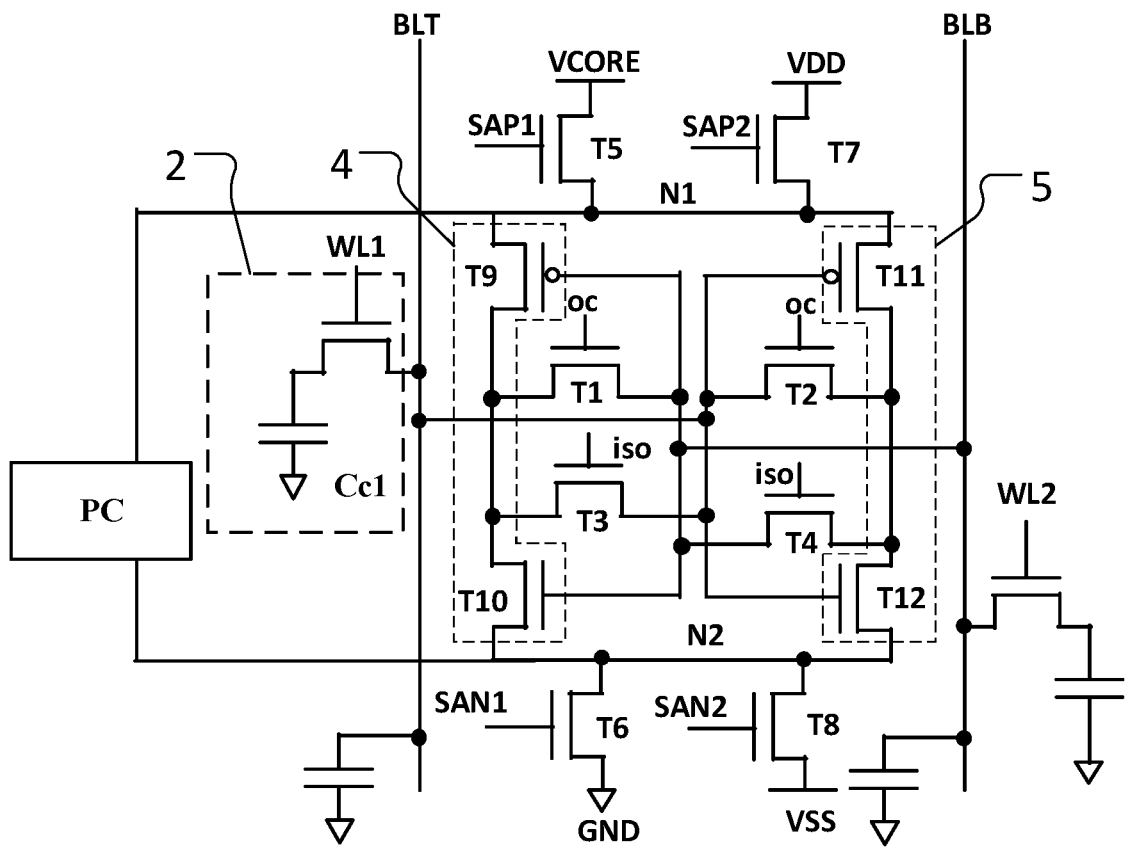
FIG. 6 is a schematic structural diagram of an exemplary sensitivity amplifier according to some embodiments of the present disclosure.

Based on this, the exemplary embodiment provides a sensitivity amplifier as shown in FIG. 6, which is a schematic structural diagram of the sensitivity amplifier according to the present disclosure. The sensitivity amplifier includes a first inverter 4 and a second inverter 5, first switch unit T1, second switch unit T2, third switch unit T3, fourth switch unit T4, fifth switch unit T5, sixth switch unit T6, seventh switch unit T7, and eighth switch unit T8. The high-voltage terminal of the first inverter 4 is connected to the first node N1, the low-voltage terminal is connected to the second node N2, and the input terminal is connected to the inverted bit line BLB; the high-voltage terminal of the second inverter 5 is connected to the first node N1, and the low-voltage terminal is connected to the second node N2, and the input terminal is connected to the bit line BLT; the first switch unit T1 is connected to the input terminal, the output terminal and the first control signal terminal oc of the first inverter 4, for responding to connect the signal from the first control signal terminal oc to the input terminal and the output terminal of the first inverter 4; the second switch unit T2 is connected to the input terminal, the output terminal and the first control signal terminal oc of the second inverter 5, for responding to connect the signal from the first control signal terminal oc to the input terminal and the output terminal of the first inverter 5; the third switch unit T3 is connected to the output terminal of the first inverter 4, the input terminal of the second inverter 5 and the second control signal terminal iso, for responding to connect the signal from the second control signal terminal oc to the output terminal of the invertor 4 and the input terminal of the first inverter 5; the fourth switch unit T4 is connected to the output terminal of the second inverter 5, the input terminal of the first inverter 4, and the second control signal terminal iso, for responding to the second control signal terminal iso to connect the output terminal of the second inverter 5 and the input terminal of the first inverter 4; the fifth switch unit T5 is connected to the first high-voltage signal terminal VCORE and the third control signal terminal SAP1 and the first node N1, for responding to the signal from third control signal terminal iso to transmit the signal of the first high-voltage signal terminal VCORE to the first node N1; the sixth switch unit T6 is connected to the first low-voltage signal terminal GND, the fourth control signal terminal SAN1, and the second node N2, for responding to the signal from fourth control signal terminal iso to transmit the signal of the first low-voltage signal terminal GND to the second node N2; the seventh switch unit T7 is connected to the second high-voltage signal terminal, the fifth control signal terminal SAP2, the first node N1, responding to the signal of fifth control signal terminal SAP2 to transmit the signal of the second high-voltage signal terminal VDD to the first node N1; the eighth switch unit T8 is connected to the second low-voltage signal terminal, the sixth control signal terminal SAN2, and the second node N2, responding to the signal of the sixth control signal terminal SAP2 to transmit the signal of the second low-voltage signal terminal VSS to the second node; herein, the voltage of the first high-voltage signal terminal VCORE is greater than the voltage of the second high-voltage signal terminal VDD, and the voltage of the first low-voltage signal terminal GND is greater than the voltage of the second low-voltage signal terminal VSS; or, the voltage of the first high-voltage signal terminal VCORE is less than the voltage of the second high-voltage signal terminal VDD, and the voltage of the first low-voltage signal terminal GND is less than the voltage of the second low-voltage signal terminal VSS.

The present disclosure provides a sensitivity amplifier, which includes two different power supply rails GND-VCORE and VSS-VDD. By controlling the turning on and off of the fifth switch unit, the sixth switch unit, the seventh switch unit, and the eighth switch unit to realize that the sensitivity amplifier works on the power rail VSS-VDD in the noise cancellation stage, and works on the power rail GND-VCORE in the second amplification stage. Herein, when the conductivity of the N-type transistor is greater than that of the P-type transistor in the inverter, the voltage voltage of the second high-voltage signal terminal VDD is greater than the voltage of the first high-voltage signal terminal VCORE, and the voltage of the second low-voltage signal terminal of VSS is greater than the voltage of the first low-voltage signal terminal GND; when the conductivity of the N-type transistor is less than that of the P-type transistor in the inverter, the voltage of the second high-voltage signal terminal VDD is less than the voltage of the first high-voltage signal terminal VCORE, and the voltage of the second low-voltage signal terminal VSS is less than the voltage of the first low-voltage signal terminal GND. Therefore, the voltage of the bit line and the inverted bit line deviating from VCORE/2 in the noise elimination stage of the sensitivity amplifier is reduced. Furthermore, the error of judgement in the threshold voltage of the storage logic 1 and logic 0 is avoided and then the error in noise tolerance when reading 1 and 0 is also avoided.

In this exemplary embodiment, as shown in FIG. 6, the first inverter 4 may include: a first P-type transistor T9, a second N-type transistor T10, and a first terminal of the first P-type transistor T9 is connected to the first node N1, the control terminal is connected to the input terminal of the first inverter 4, the second terminal of transistor T9 is connected to the output terminal of the first inverter 4; the first terminal of the second N-type transistor is connected to the second note N2, the control terminal is connected to the input terminal of the first inverter 4, and the second terminal of the second N-type transistor is connected to the output terminal of the first inverter 4.

In this exemplary embodiment, as shown in FIG. 6, the second inverter 5 may include: a third P-type transistor T11 and a fourth N-type transistor T12. The first terminal of the third P-type transistor T11 is connected to the first node N1, the control terminal is connected to the input terminal of the second inverter 5, and the second terminal is connected to the output terminal of the second inverter 5; the first terminal of the fourth N-type transistors is connected to the second node N2, the control terminal is connected to the input terminal of the second inverter 5, and the second terminal is connected to the output terminal of the second inverter 5.

In this exemplary embodiment, as shown in FIG. 6, the first switching unit T1 may include a fifth transistor, the first terminal of the first switching unit T1 is connected to the input terminal of the first inverter 4, and the second terminal is connected to the output terminal of the first inverter 4, the control terminal is connected to the first control signal terminal oc; the second switch unit T2 may include a sixth transistor, the first terminal of the sixth transistor is connected to the input terminal of the second inverter 5, the second terminal is connected to the output terminal of the second inverter 5, and the control terminal is connected to the first control signal terminal oc.

In this exemplary embodiment, as shown in FIG. 6, the third switch unit T3 may include a seventh transistor, the first terminal of seventh transistor is connected to the output terminal of the first inverter 4, and the second terminal is connected to the input terminal of the second inverter 5, the control terminal is connected to the second control signal terminal iso; the fourth switch unit T4 may include an eighth transistor, and the first terminal of the eighth transistor is connected to the output terminal of the second inverter 5, the second terminal is connected to the input terminal of the first inverter 4, and the control terminal is connected to the second control signal terminal iso.

In this exemplary embodiment, as shown in FIG. 6, the fifth switch unit T5 may include a ninth transistor, the first terminal of the ninth transistor is connected to the first high-voltage signal terminal, and the second terminal is connected to the first node N1, the control terminal is connected to the third control signal terminal SAP1; the sixth switch unit T6 may include a tenth transistor, the first terminal of the tenth transistor is connected to the first low-voltage signal terminal, and the second terminal is connected to the second node N2, and the control terminal is connected to the fourth control signal terminal SAN1.

In this exemplary embodiment, as shown in FIG. 6, the seventh switch unit T7 may include an eleventh transistor, a first terminal of the eleventh transistor is connected to the second high-voltage signal terminal VDD, and a second terminal is connected to the first node N1, the control terminal is connected to the fifth control signal terminal SAP2; the eighth switch unit T8 may include a twelfth transistor, and the first terminal of the twelfth transistor is connected to the second low voltage signal terminal VSS, the second terminal is connected to the second node N2, and the control terminal is connected to the sixth control signal terminal SAN2.

In this exemplary embodiment, the switch units from the first to the eighth may be N-type transistors or P-type transistors, and this embodiment describes N-type transistors as an example.

In this exemplary embodiment, as shown in FIG. 6, the sensitivity amplifier may further include a pre-charging unit PC, which is connected to the first node N1 and the second node N2.

Figure 7:
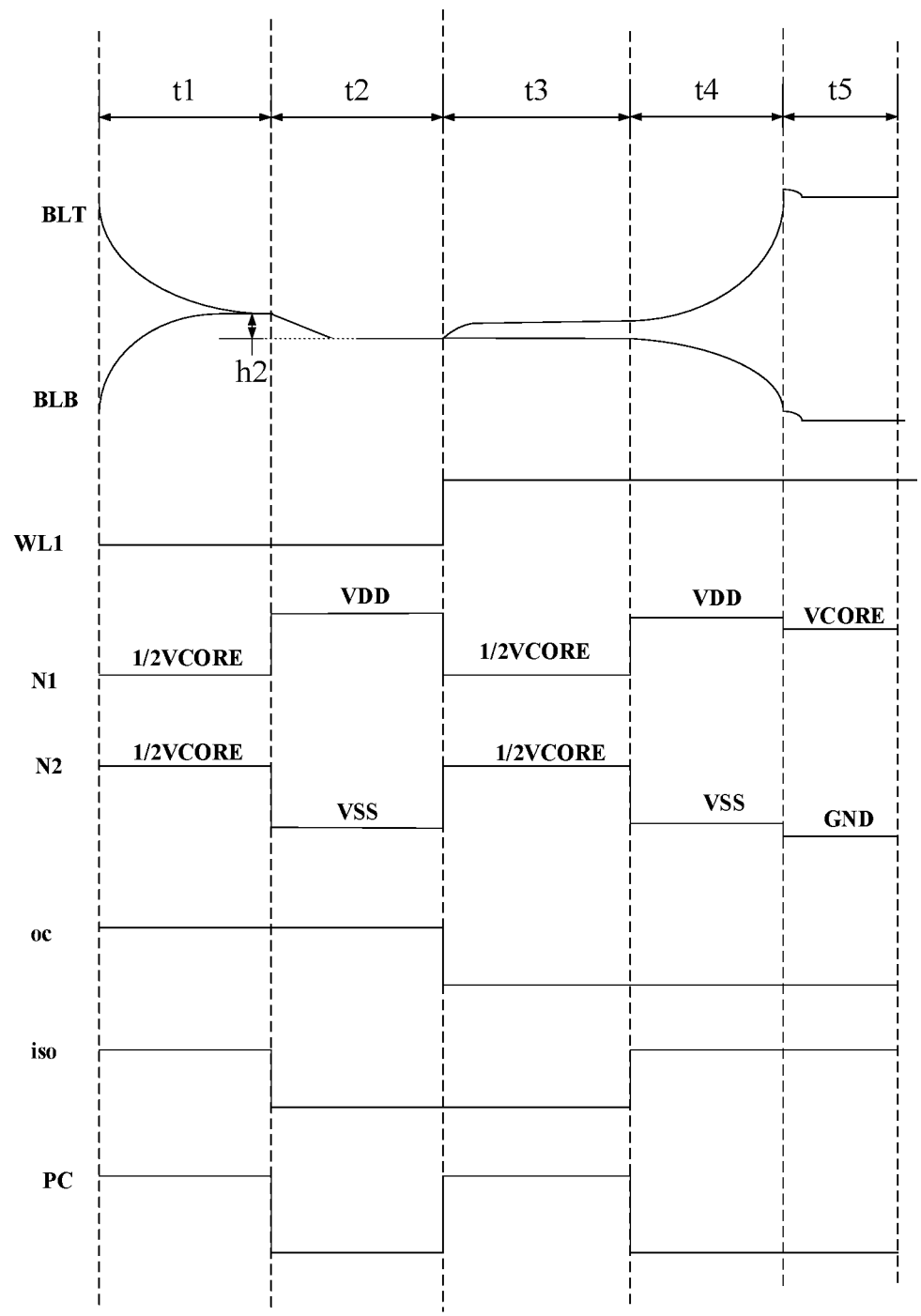
FIG. 7 is a working sequence diagram at each node in an exemplary sensitivity amplifier according to some embodiments of the present disclosure.

The exemplary embodiment also provides a sensitivity amplifier driving method for driving the above-mentioned sensitivity amplifier. As shown in FIG. 7, which is a timing diagram for driving each node in of the sensitivity amplifier according to an exemplary embodiment of the present disclosure. The method includes: a pre-charging stage t1, a noise elimination stage t2, a charge sharing stage t3, a first amplification stage t4, and a second amplification stage t5.

This exemplary embodiment uses an example in which the conductivity of the N-type transistor is greater than that of the P-type transistor in the inverter. Accordingly, the voltage of the second high-voltage signal terminal VDD is greater than the voltage of the first high-voltage signal terminal VCORE, and the voltage of the second low-voltage signal terminal VSS is greater than the voltage of the first low-voltage signal terminal GND. It should be understood that when the conductivity of the N-type transistor is smaller than that of the P-type transistor in the inverter, the voltage of the second high-voltage signal terminal VDD is less than the voltage of the first high-voltage signal terminal VCORE. The voltage of the second low voltage signal terminal VSS is less than the voltage of the first low voltage signal terminal GND. For example, in this embodiment, the voltage of the first high-voltage signal terminal VCORE may be 1V, the voltage of the first low-voltage signal terminal GND may be 0V, and the voltage of the second high-voltage signal terminal VDD may be 1.2V, the voltage of the second low voltage signal terminal VSS is 0.2V.

In the initialization phase, an effective voltage signal is applied to the first control signal terminal oc and the second control signal terminal iso, and an invalid voltage signal is applied to the third control signal terminal SAP1, the fourth control signal terminal SAN1, and the fifth control signal terminal SAP2 and the sixth control signal terminal SAN2, At the same time, pre-charging the first node and the second node so that the first node N1, the second node N2, the bit line BLT, and the inverted bit line BLB all have voltages the same as pre-charging voltages. Herein, the pre-charging voltage may be half of the voltage of the first high-voltage signal terminal VCORE, that is, 0.5V.

In the noise elimination stage, an effective voltage signal is applied to the first control signal terminal oc, the fifth control signal terminal SAP2, and the sixth control signal terminal SAN2, and an invalid voltage signal is applied to the second control signal terminal iso, the third control signal terminal SAP1 and the fourth control signal terminal SAN1. At this stage, the transistors T9 and T10 form a diode voltage divider structure between the second high-voltage signal terminal VDD and the second low-voltage signal terminal VSS. The transistors T11 and T12 form a diode voltage divider structure 1 between the second high-voltage signal terminal VDD and the second low-voltage signal terminal VSS. Since the conductivity of T10 is greater than that of T9, the conductivity of T12 is greater than that of T11, the bit line BLT and the reverse bit line BLB still has a voltage drop h2, but because the voltage of the second high-voltage signal terminal VDD is greater than the voltage of the first high-voltage signal terminal VCORE, the voltage of the second low-voltage signal terminal VSS is greater than the voltage of the first low-voltage signal terminal GND. The voltage drop h2 is smaller than the voltage drop h1 in FIG. 5, so that the voltage on the bit line BLT and the voltage on the inverted bit line BLB are closer to half of the VCORE voltage, that is, 0.5V.

In this exemplary embodiment, as shown in FIG. 7, the difference in the conductivities of the transistors T9 and T10 may be the same as the difference in the conductivities of the transistors T11 and T12, so that in the noise elimination stage, the voltages on the bit line BLT and the inverted bit line BLB decreases simultaneously. It should be understood that in other examples, when the difference in the conductivities of the transistors T9 and T10 may be different from the difference in the conductivities of the transistors T11 and T12, accordingly, voltage changes on the bit line BLT and the inverted bit line BLB are not synchronized, and their voltage changes are also different.

In the charge sharing stage, a pre-charging voltage is input to the first node and the second node, and the pre-charging voltage may be half of the voltage of the first high-voltage signal terminal VCORE. And the first control signal terminal oc, the second control signal terminal iso, the third control signal terminal SAP1, the fourth control signal terminal SAN1, the fifth control signal terminal SAP2, the sixth control signal terminal SAN2 are controlled to output an invalid voltage signal, and simultaneously a data signal is input to the bit line. The data signal may be a high-level voltage data signal in the storage unit. For example, the word line WL1 connected to the storage unit 2 can be controlled to output an effective voltage so that the charge stored in the capacitor Cc1 is transferred to the bit line BLT through the transistor. At this time, the voltage on the bit line BLT is slightly greater than that on the inverted bit line BLB. The voltage. It should be understood that the data signal may also be a low-voltage data signal in the storage unit. Accordingly, the voltage on the bit line BLT is slightly smaller than the voltage on the inverted bit line BLB.

In the first amplification stage, an effective voltage signal is applied to the second control signal terminal, the fifth control signal terminal, and the sixth control signal terminal, and an invalid voltage signal is applied to the first control signal terminal, the third control signal terminal, and the fourth control signal terminal, so that the latch formed by the first inverter and the second inverter works at the second high-voltage signal terminal VDD and the second low-voltage signal terminal VSS, to perform the first amplification process on the data signal. Finally, the voltage on the bit line BLT is amplified to the voltage of the second high-voltage signal terminal VDD, and the voltage on the inverted bit line BLB is reduced to the voltage of the second low-voltage signal terminal VSS.

In the second amplification stage, an effective voltage signal is applied to the second control signal terminal, the third control signal terminal, and the fourth control signal terminal, and an invalid voltage signal is applied at the first control signal terminal, the fifth control signal terminal, and the sixth control signal terminal, so that the latch formed by the first inverter and the second inverter works between the first high-voltage signal terminal VCORE and the first low-voltage signal terminal GND, to perform a second amplification process on the data signal. Finally, the voltage on the bit line BLT is amplified to the voltage of the first high-voltage signal terminal VCORE, and the voltage on the inverted bit line BLB is reduced to the voltage of the first low-voltage signal terminal GND.

Using the driving method, in the noise elimination stage, the sensitivity amplifier works between the second high-voltage signal terminal VDD and the second low-voltage signal terminal VSS. And because the voltage of the first high-voltage signal terminal VCORE is less than the voltage of the second high-voltage signal terminal VDD, and the voltage of the first low-voltage signal terminal GND is less than the voltage of the first low voltage signal terminal VSS. As a result, the voltages on the bit line BLT and the inverted bit line BLB are closer to VCORE/2 than in the related art. Thus, it is avoided the errors in the judgement of the thresholds of storage logic 1 and the logic 0, and then avoided the difference in noise tolerance when reading 1 and 0.

Herein, pre-charging the first node and the second node with the voltage can be implemented by the pre-charging unit PC. PC in FIG. 7 represents a signal timing diagram of the pre-charging unit PC.

This exemplary embodiment also provides a storage device which includes the above-mentioned sensitivity amplifier.

Those skilled in the art will easily think of other embodiments of the present disclosure after considering the specification and practicing the disclosure disclosed herein. This application is intended to cover any variations, uses, or adaptive changes of the present disclosure. These variations, uses, or adaptive changes follow the general principles of the present disclosure and include common knowledge or conventional technical means in the technical field not disclosed in the present disclosure. The description and embodiments are only regarded as exemplary, and the true scope and spirit of the present disclosure are pointed out by the claims.

It should be understood that the present disclosure is not limited to the precise structure that has been described above and shown in the drawings, and various modifications and changes can be made without departing from its scope. The scope of the present disclosure is only limited by the appended claims.

What is claimed is:

1. A sensitivity amplifier, comprising:
a first inverter, comprising a high voltage terminal connected to a first node, a low voltage terminal connected to a second node, wherein an input terminal of the first inverter connects to a reverse bit line;
a second inverter, comprising a high voltage terminal connected to the first node, a low voltage terminal connected to the second node, wherein an input terminal of the second inverter connects to a bit line;
a first switch unit connected to the input terminal, an output terminal, and a first control signal terminal of the first inverter, wherein the first switch unit responds to a signal of the first control signal terminal to connect the input terminal and the output terminal of the first inverter;
a second switch unit connected to the input terminal, an output terminal, and a first control signal terminal of the second inverter, wherein the second switch unit responds to a signal of the second control signal terminal to connect the input terminal and the output terminal of the second inverter;
a third switch unit connected to the output terminal of the first inverter, the input terminal of the second inverter, and a second control signal terminal, wherein the third switch unit responds to a signal of the second control signal terminal to connect the output terminal of the first inverter and the input terminal of the second inverter;
a fourth switch unit connected to the output terminal of the second inverter, the input terminal of the first inverter, and the second control signal terminal, wherein the third switch unit responds to the signal of the second control signal terminal to connect the output terminal of the second inverter and the input terminal of the first inverter;
a fifth switch unit connected to a first high-voltage signal terminal, a third control signal terminal, and the first node, wherein the fifth switch unit responds to a signal of the third control signal terminal to transmit a signal from the first high-voltage signal terminal to the first node;

a sixth switch unit connected to a first low-voltage signal terminal, a fourth control signal terminal, and the first node, wherein the sixth switch unit responds to a signal of the fourth control signal terminal to transmit a signal from the first low-voltage signal terminal to the second node;

a seventh switch unit connected to a second high-voltage signal terminal, a fifth control signal terminal, and the first node, wherein the seventh switch unit responds to a signal of the fifth control signal terminal to transmit a signal from the second high-voltage signal terminal to the second node; and an eighth switch unit connected to a second low-voltage signal terminal, a sixth control signal terminal, and the second node, wherein the eighth switch unit responds to a signal of the sixth control signal terminal to transmit a signal from the second low-voltage signal terminal to the second node;

wherein, a voltage of the first high-voltage signal terminal is greater than a voltage of the second high-voltage signal terminal, and a voltage of the first low-voltage signal terminal is greater than a voltage of the second low-voltage signal terminal; or wherein the voltage of the first high-voltage signal terminal is smaller than the voltage of the second high-voltage signal terminal, and the voltage of the first low-voltage signal terminal is smaller than the voltage of the second low-voltage signal terminal.

2. The sensitivity amplifier of claim 1, wherein the first inverter comprises:
a first P-type transistor, having a first terminal connected to the first node, a control terminal connected to the input terminal of the first inverter, and a second terminal connected to the output terminal of the first inverter;
a second N-type transistor, having a first terminal connected to the second node, a control terminal connected to the input terminal of the first inverter, and a second terminal connected to the output terminal of the first inverter.

3. The sensitivity amplifier of claim 1, wherein the second inverter comprises:
a third P-type transistor, having a first terminal connected to the first node, a control terminal connected to the input terminal of the second inverter, and a second terminal connected to the output terminal of the second inverter;
a fourth N-type transistor, having a first terminal connected to the second node, a control terminal connected to the input terminal of the second inverter, and a second terminal connected to the output terminal of the second inverter.

4. The sensitivity amplifier according to claim 1, wherein the first switch unit comprises:
a fifth transistor, having a first terminal connected to the input terminal of the first inverter, a second terminal connected to the output terminal of the first inverter, and a control terminal connected to the first control signal terminal of the first inverter; and
wherein the second switch unit comprises:
a sixth transistor, having a first terminal connected to the input terminal of the second inverter, the second terminal connected to the output terminal of the second inverter, and a control terminal connected to the first control signal terminal of the second inverter.

5. The sensitivity amplifier according to claim 1, wherein the third switch unit comprises:

a third switch transistor, having a first terminal connected to the output terminal of the first inverter, a second terminal connected to the input terminal of the second inverter, and a control terminal connected to the second control signal terminal; and
wherein the fourth switch unit comprises:
an eighth transistor, having a first terminal connected to the output terminal of the second inverter, a second terminal connected to the input terminal of the first inverter, and a control terminal connected to the second control signal terminal.

6. The sensitivity amplifier according to claim 1, wherein the fifth switch unit comprises:
a ninth transistor, having a first terminal connected to the first high-voltage signal terminal, a second terminal connected to the first node, and a control terminal connected to the third control signal terminal; and
wherein the sixth switch unit includes:
a tenth transistor, having a first terminal connected to the first low-voltage signal terminal, a second terminal connected to the second node, and a control terminal connected to the fourth control signal terminal.

7. The sensitivity amplifier according to claim 1, wherein the seventh switch unit comprises:
an eleventh transistor, having a first terminal connected to the second high-voltage signal terminal, a second terminal connected to the first node, and a control terminal connected to the fifth control signal terminal;
wherein the eighth switch unit comprises:
a twelfth transistor, having a first terminal connected to the second low-voltage signal terminal, a second terminal connected to the second node, and a control terminal connected to the sixth control signal terminal.

8. The sensitivity amplifier of claim 1, wherein the sensitivity amplifier further comprises:
a pre-charging unit configured to charge the first node and the second node to the same potential.

9. A method for driving a sensitivity amplifier according to claim 1, comprising:
in an initialization stage, applying effective voltage signals to the first control signal terminal and the second control signal terminal, and applying invalid voltage signals to the third control signal terminal, the fourth control signal terminal, the fifth control signal terminal, and the sixth control signal terminal, and pre-charging the first node and the second node;
in a noise elimination stage, controlling the first control signal terminal, the fifth control signal terminal, and the sixth control signal terminal to output effective voltage signals, and controlling the second control signal terminal, the third control signal terminal, and the fourth control signal terminal to output invalid voltage signals;
in the charge sharing stage, pre-charging the first node and the second node, controlling the first control signal terminal, the second control signal terminal, the third control signal terminal, the fourth control signal terminal, the fifth control signal terminal and the sixth control signal terminal to output invalid voltage signals, and inputting a data signal to the bit line simultaneously;
in the first amplification stage, controlling the second control signal terminal, the fifth control signal terminal, and the sixth control signal terminal to output effective voltage signals, and controlling the first control signal terminal, the third control signal terminal, and the fourth control signal terminal to output invalid voltage signals, to perform a first amplification process on the data signal; and in the second amplification stage, controlling the second control signal terminal, the third control signal terminal, and the fourth control signal terminal to output effective voltage signals, and controlling the first control signal terminal, the fifth control signal terminal, the sixth control signal terminal to output invalid voltage signals, to perform a second amplification process on the data signal.

10. A storage device comprising the sensitivity amplifier according to claim 1.

* * * * *